(12) United States Patent
Hsieh et al.

(10) Patent No.: US 7,368,886 B2
(45) Date of Patent: May 6, 2008

(54) METHOD OF TESTING MOTOR TORQUE INTEGRITY IN A HYBRID ELECTRIC VEHICLE

(75) Inventors: Tung-Ming Hsieh, Carmel, IN (US); Gregory A. Hubbard, Brighton, MI (US); Jy-Jen F. Sah, West Bloomfield, MI (US)

(73) Assignee: General Motors Corporation, Detroit, MI (US)

( * ) Notice: Subject to any disclaimer, the term of this patent is extended or adjusted under 35 U.S.C. 154(b) by 778 days.

(21) Appl. No.: 10/846,000

(22) Filed: May 14, 2004

(65) Prior Publication Data

US 2005/0256618 A1    Nov. 17, 2005

(51) Int. Cl.
*H02P 1/04* (2006.01)
(52) U.S. Cl. ............ 318/430; 318/431; 318/432; 318/434; 318/139
(58) Field of Classification Search ........ 318/139, 318/430–434, 587; 180/65.3, 65.2; 388/811, 388/825; 701/22, 113; 475/153; 477/15
See application file for complete search history.

(56) References Cited

U.S. PATENT DOCUMENTS

| | | | | |
|---|---|---|---|---|
| 5,412,294 A | * | 5/1995 | Anzai | 318/432 |
| 5,533,166 A | * | 7/1996 | Yoshida et al. | 388/811 |
| 5,731,669 A | * | 3/1998 | Shimizu et al. | 318/139 |
| 5,931,757 A | | 8/1999 | Schmidt | |
| 6,441,574 B1 | * | 8/2002 | Phillips et al. | 318/432 |
| 6,449,537 B1 | * | 9/2002 | Phillips et al. | 701/22 |
| 6,581,705 B2 | * | 6/2003 | Phillips et al. | 180/65.2 |
| 6,756,758 B2 | * | 6/2004 | Karikomi et al. | 318/434 |
| 6,816,759 B2 | * | 11/2004 | Kimura | 701/22 |
| 6,931,318 B2 | * | 8/2005 | Kaita et al. | 701/113 |
| 7,024,290 B2 | * | 4/2006 | Zhao et al. | 701/22 |
| 7,192,374 B2 | * | 3/2007 | Kuras et al. | 475/153 |
| 2004/0179831 A1 | * | 9/2004 | Tsuruta | 388/825 |
| 2006/0175995 A1 | * | 8/2006 | Shinmura et al. | 318/139 |
| 2006/0196711 A1 | * | 9/2006 | Endo | 180/65.3 |

FOREIGN PATENT DOCUMENTS

| | | |
|---|---|---|
| DE | 4141947 A | 6/1993 |
| DE | 19735022 A1 | 2/1999 |
| DE | 19527112 C1 | 9/2006 |

* cited by examiner

*Primary Examiner*—Paul Ip

(57) ABSTRACT

A method of testing an electric motor that is adapted to provide a desired electric motor output torque to a vehicle powertrain system comprising an engine and the electric motor which are operatively and selectively coupled to a transmission. The method includes the steps of determining an initial motor speed of the electric motor, determining a motor torque command as a function of the initial motor speed, applying the motor torque command to the electric motor to produce an output torque from the electric motor, measuring a resultant motor speed of the electric motor and establishing a motor status as a function of the resultant motor speed. The method may be implemented as a computer control and diagnostic algorithm.

24 Claims, 9 Drawing Sheets

METHOD OF TESTING MOTOR TORQUE INTEGRITY IN A HYBRID ELECTRIC VEHICLE

TECHNICAL FIELD

The present invention generally relates to vehicle powertrain systems. More particularly, the invention relates to testing motor torque integrity of an electric motor used for the propulsion of a hybrid electric vehicle (HEV) powertrain system.

BACKGROUND OF THE INVENTION

An HEV is a vehicle that has a vehicle powertrain system for propulsion that consists of at least one electric motor or electric machine in combination with at least one other power source. Typically, the other power source is a gasoline or diesel engine. There are various types of HEVs depending on how the electric motor(s) and other power source(s) are combined with one another in order to provide propulsion for the vehicle, including series, parallel and compound HEVs, including those having electrically variable transmissions (EVTs) which provide for continuously variable speed ratios by combining features from both series and parallel HEV powertrain architectures.

The development of new HEV powertrain systems and architectures also facilitate and necessitate the development and implementation of novel vehicle operating and diagnostic methodologies which are adapted to utilize and assess novel features of these systems, including assessing the status and availability of certain systems, subsystems and components to perform their intended function. This information is particularly desirable in conjunction with restarting of the HEV from a shutdown or "key-off" condition to a restart or "key-on" condition, because on key-off much of the system is powered off in order to conserve the state of charge of the energy storage system, such as a battery pack or array. As such, changes in the status of many of the vehicle systems, subsystems and components are unknown, and it is preferred to test certain of them in order to verify their operational status prior to utilization of the powertrain system. For example, if maintenance is performed on the vehicle during the key-off condition, it may be desirable to ensure that cetain of the vehicle systems, subsystems and components are working properly prior to returning the vehicle to service. One such item for which information about the status and availability is desired is the electric motor(s) used for propulsion of the vehicle with respect to its integrity or ability to produce the desired output torque for propulsion of the HEV powertrain system.

Therefore, it is very desirable to develop a method for testing the electric motor(s) used for propulsion in an HEV powertrain system prior to utilization of the system in order to determine whether it is capable of producing the desired output torque.

SUMMARY OF THE INVENTION

The present invention is a method of testing an electric motor that is adapted to provide a desired electric motor output torque to a vehicle powertrain system comprising an engine and the electric motor which are operatively and selectively coupled to a transmission, comprising the steps of determining an initial motor speed of the electric motor; determining a motor torque command as a function of the initial motor speed; applying the motor torque command to the electric motor to produce an output torque from the electric motor; measuring a resultant motor speed of the electric motor; and establishing a motor status as a function of the resultant motor speed. The motor torque command is a positive torque command if the initial motor speed is positive and a negative torque command if the motor speed is negative, wherein positive and negative torque and positive and negative rotational speed are determined with respect to a common rotational reference.

The present invention is advantageous in that it is adapted to determine the status or availability of an electric motor of an HEV powertrain system to produce the appropriate output torque prior to any attempt to produce torque using the motor for propulsion of the vehicle. The status may be used in various ways by the system to enable or disable the motor, such as, for example, by disallowing its use if an issue associated with the motor is identified. It is believed that issues associated with the motor or motor encoder wiring can be detected using this method.

BRIEF DESCRIPTION OF THE DRAWINGS

The present invention will be more fully understood from the accompanying drawings, in which.

DESCRIPTION OF THE PREFERRED EMBODIMENT

Figure 1:
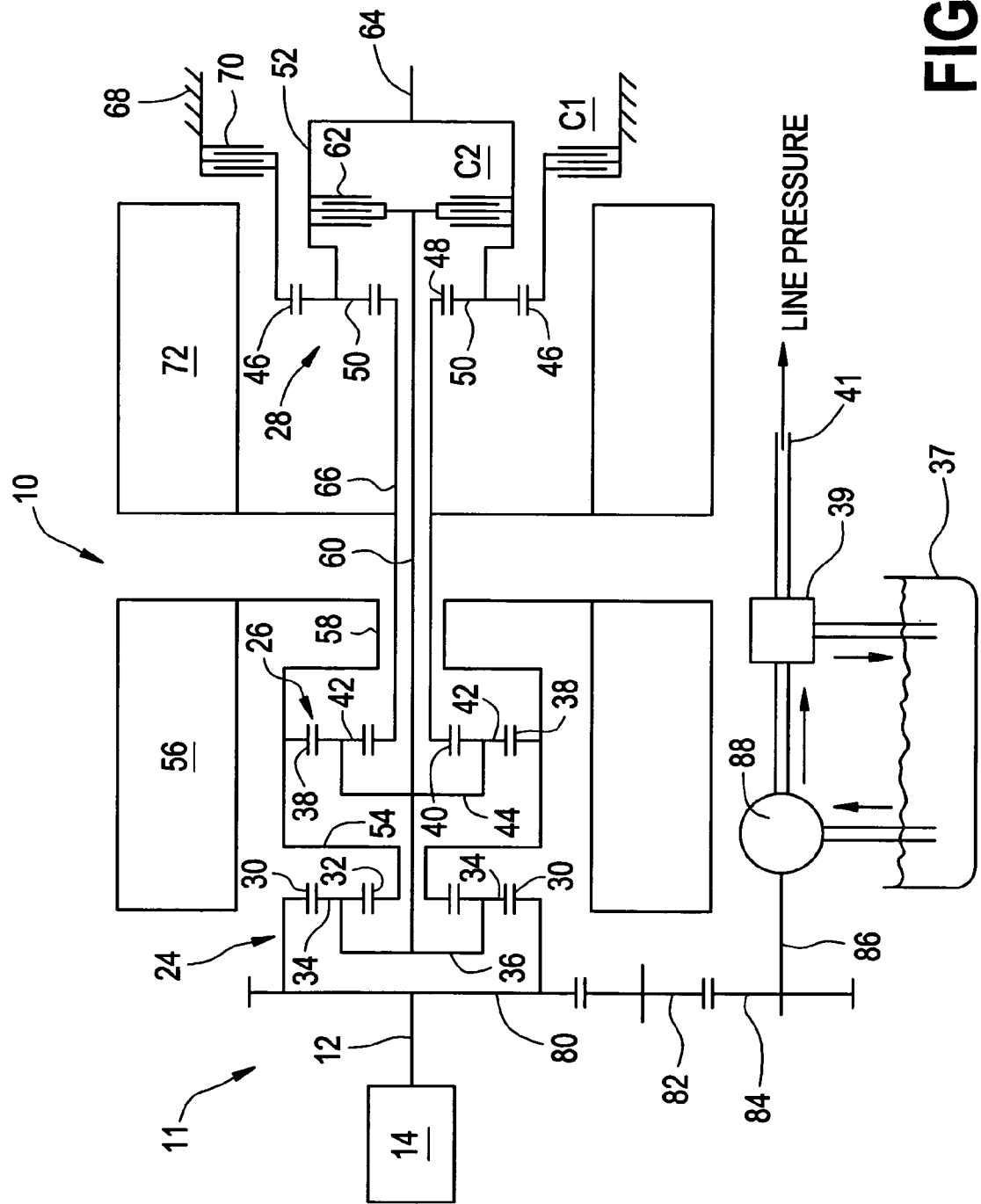
FIG. 1 is a mechanical hardware schematic representation of one preferred form of a two-mode, compound-split, electrically variable powertrain system particularly suited to the control of the present invention.
Figure 2:
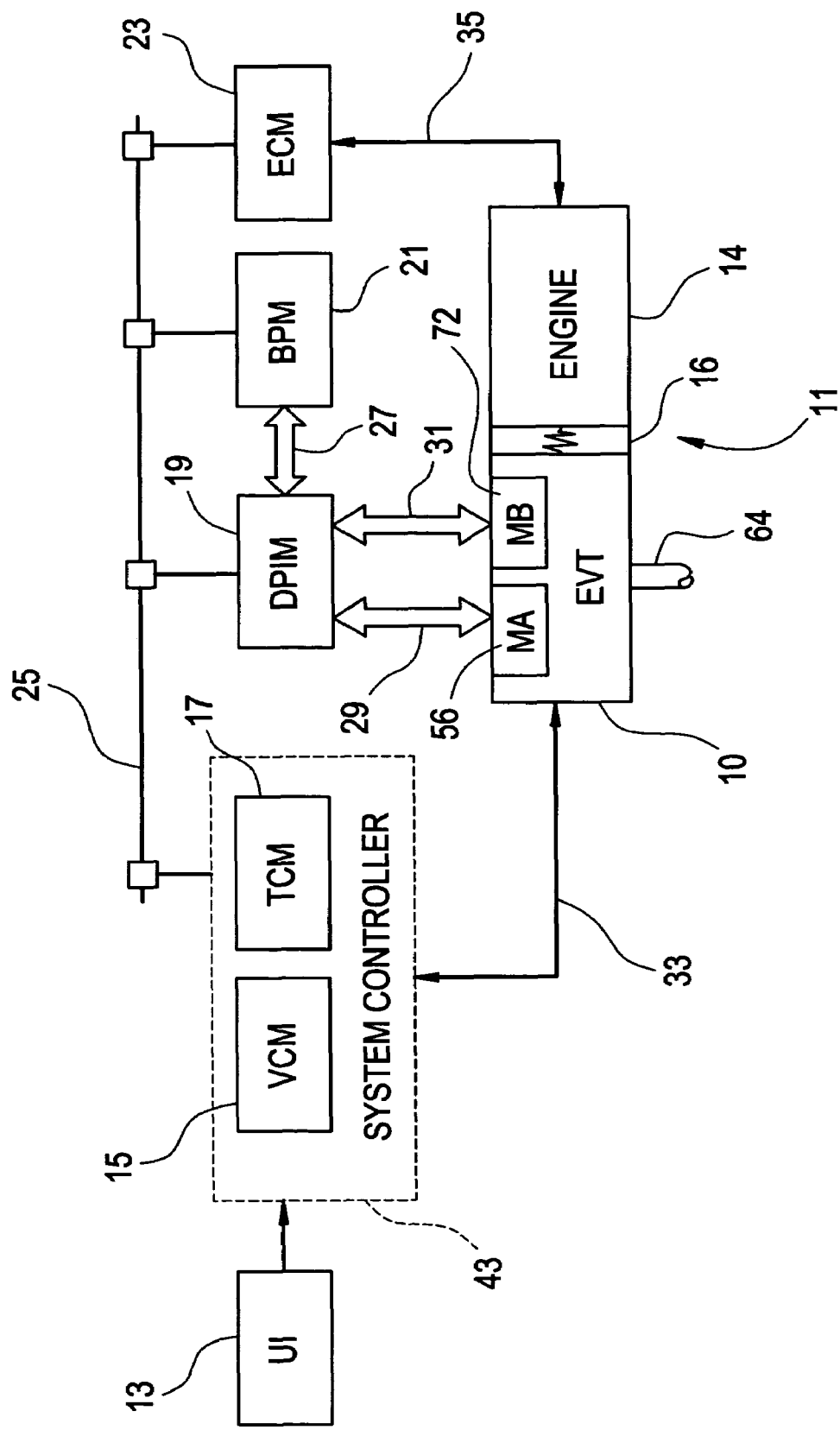
FIG. 2 is an electrical and mechanical schematic of a preferred system architecture for implementing the control of the present invention.

With reference first to FIGS. 1 and 2, a vehicular powertrain is generally designated 11. Included in the powertrain 11 is one representative form of a multi-mode, compound-split, electrically variable transmission (EVT) particularly suited for implementing the controls of the present invention and designated generally by the numeral 10 in FIGS. 1 and 2. With particular reference, then, to those FIGS., the EVT 10 has an input member 12 that may be in the nature of a shaft which may be directly driven by an engine 14 or, as shown in FIG. 2, a transient torque damper 16 may be incorporated between the output member of the engine 14 and the input member of the EVT 10. The transient torque damper 16 may incorporate, or be employed in conjunction with, a torque transfer device (not shown) to permit selective engagement of the engine 14 with the EVT 10, but it must be understood that such a torque transfer device is not utilized to change, or control, the mode in which the EVT 10 operates.

In the embodiment depicted the engine 14 may be an internal combustion engine, such as a diesel engine, which is readily adapted to provide its available power output delivered at a constant number of revolutions per minute (RPM). In the exemplary embodiment to which FIGS. 1 and 2 are directed, the engine 14 can—after start-up, and during the majority of its input—operate at a constant speed or at a variety of constant speeds in accordance with a desired operating point as may be determined from operator inputs and driving conditions.

The EVT 10 utilizes three planetary gear subsets 24, 26 and 28. The first planetary gear subset 24 has an outer gear member 30, that may generally be designated as the ring gear, which circumscribes an inner gear member 32, generally designated as the sun gear. A plurality of planet gear members 34 are rotatably mounted on a carrier 36 such that each planet gear member 34 meshingly engages both the outer gear member 30 and the inner gear member 32.

The second planetary gear subset 26 also has an outer gear member 38, generally designated as the ring gear, which circumscribes an inner gear member 40, generally designated as the sun gear. A plurality of planet gear members 42 are rotatably mounted on a carrier 44 such that each planet gear 42 meshingly engages both the outer gear member 38 and the inner gear member 40.

The third planetary gear subset 28 also has an outer gear member 46, generally designated as the ring gear, which circumscribes an inner gear member 48, generally designated as the sun gear. A plurality of planet gear members 50 are rotatably mounted on a carrier 52 such that each planet gear 50 meshingly engages both the outer gear member 46 and the inner gear member 48.

While all three planetary gear subsets 24, 26 and 28 are "simple" planetary gear subsets in their own right, the first and second planetary gear subsets 24 and 26 are compounded in that the inner gear member 32 of the first planetary gear subset 24 is conjoined, as through a hub plate gear 54, to the outer gear member 38 of the second planetary gear subset 26. The conjoined inner gear member 32 of the first planetary gear subset 24 and the outer gear member 38 of the second planetary gear subset 26 are continuously connected to a first motor/generator 56, as by a sleeve shaft 58. First motor/generator 56 may also be referred to herein variously as motor A or $M_A$.

The planetary gear subsets 24 and 26 are further compounded in that the carrier 36 of the first planetary gear subset 24 is conjoined, as through a shaft 60, to the carrier 44 of the second planetary gear subset 26. As such, carriers 36 and 44 of the first and second planetary gear subsets 24 and 26, respectively, are conjoined. The shaft 60 is also selectively connected to the carrier 52 of the third planetary gear subset 28, as through a torque transfer device 62 which, as will be hereinafter more fully explained, is employed to assist in the selection of the operational modes of the EVT 10. Torque transfer device 62 may also be referred to herein variously as second clutch, clutch two or C2.

The carrier 52 of the third planetary gear subset 28 is connected directly to the transmission output member 64. When the EVT 10 is used in a land vehicle, the output member 64 may be connected to the vehicular axles (not shown) that may, in turn, terminate in the drive members (also not shown). The drive members may comprise either front or rear wheels of the vehicle on which they are employed, or they may be the drive gear of a track vehicle.

The inner gear member 40 of the second planetary gear subset 26 is connected to the inner gear member 48 of the third planetary gear subset 28, as through a sleeve shaft 66 that circumscribes shaft 60. The outer gear member 46 of the third planetary gear subset 28 is selectively connected to ground, represented by the transmission housing 68, through a torque transfer device 70. Torque transfer device 70, as is also hereinafter explained, is also employed to assist in the selection of the operational modes of the EVT 10. Torque transfer device 70 may also be referred to herein variously as first clutch, clutch one or C1.

The sleeve shaft 66 is also continuously connected to a second motor/generator 72. Second motor/generator 72 may also be referred to herein variously as motor B or $M_B$. All the planetary gear subsets 24, 26 and 28 as well as motor A and motor B (56, 72) are coaxially oriented, as about the axially disposed shaft 60. It should be noted that both motors A and B are of an annular configuration which permits them to circumscribe the three planetary gear subsets 24, 26 and 28 such that the planetary gear subsets 24, 26 and 28 are disposed radially inwardly of the motors A and B. This configuration assures that the overall envelope—i.e., the circumferential dimension—of the EVT 10 is minimized.

A drive gear 80 may be presented from the input member 12. As depicted, the drive gear 80 fixedly connects the input member 12 to the outer gear member 30 of the first planetary gear subset 24, and the drive gear 80, therefore, receives power from the engine 14 and/or the motor/generators 56 and/or 72. The drive gear 80 meshingly engages an idler gear 82 which, in turn, meshingly engages a transfer gear 84 that is secured to one end of a shaft 86. The other end of the shaft 86 may be secured to a transmission fluid pump 88 and which is supplied transmission fluid from sump 37, delivering high pressure fluid to regulator 39 which returns a portion of the fluid to sump 37 and provides regulated line pressure in line 41.

In the described exemplary mechanical arrangement, the output member 64 receives power through two distinct gear trains within the EVT 10. A first mode, or gear train, is selected when the first clutch C1 is actuated in order to "ground" the outer gear member 46 of the third planetary gear subset 28. A second mode, or gear train, is selected when the first clutch C1 is released and the second clutch C2 is simultaneously actuated to connect the shaft 60 to the carrier 52 of the third planetary gear subset 28.

Those skilled in the art will appreciate that the EVT 10 is capable of providing a range of output speeds from relatively slow to relatively fast within each mode of operation. This combination of two modes with a slow to fast output speed range in each mode allows the EVT 10 to propel a vehicle from a stationary condition to highway speeds. In addition, a fixed-ratio state wherein both clutches C1 and C2 are simultaneously applied is available for efficient mechanical coupling of the input member to the output member through a fixed gear ratio. Furthermore, a neutral state wherein both clutches C1 and C2 are simultaneously released is available for mechanically decoupling the output member from the transmission. Finally, the EVT 10 is capable to provide synchronized shifts between the modes wherein slip speed across both clutches C1 and C2 is substantially zero. Additional details regarding operation of the exemplary EVT can be found in commonly assigned U.S. Pat. No. 5,931,757, the contents of which are incorporated herein by reference.

Engine 14 is preferably a diesel engine and electronically controlled by engine control module (ECM) 23 as illustrated in FIG. 2. ECM 23 is a conventional microprocessor based diesel engine controller comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O) and appropriate signal conditioning and buffer circuitry. ECM 23 functions to acquire data from a variety of sensors and control a variety of actuators, respectively, of the engine 14 over a plurality of discrete lines. For simplicity, ECM 23 is shown generally in bi-directional interface with engine 14 via aggregate line 35. Among the various parameters that may be sensed by ECM 23 are oil sump and engine coolant temperatures, engine speed (Ne), turbo pressure, and ambient air temperature and pressure. Various actuators that may be controlled by the ECM 23 include fuel injectors, fan controllers, engine preheaters including glow plugs and grid-type intake air heaters. ECM preferably provides for well known torque based controls for engine 14 in response to a torque command Te_cmd provided by the EVT control system. Such engines electronics, controls and quantities are generally well known to those skilled in the art and further detailed exposition thereof is not required herein.

As should be apparent from the foregoing description the EVT 10 selectively receives power from the engine 14. As will now be explained with continued reference to FIG. 2 the EVT also receives power from an electric storage device such as one or more batteries in battery pack module (BPM) 21. Other electric storage devices that have the ability to store electric power and dispense electric power may be used in place of the batteries without altering the concepts of the present invention. The BPM 21 is high voltage DC coupled to dual power inverter module (DPIM) 19 via DC lines 27. Current is transferable to or from the BPM 21 in accordance with whether the BPM 21 is being charged or discharged. DPIM 19 includes a pair of power inverters and respective motor controllers configured to receive motor control commands and control inverter states therefrom for providing motor drive or regeneration functionality. Motor controllers are microprocessor based controllers comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O) and appropriate signal conditioning and buffer circuitry. In motoring control, the respective inverter receives current from the DC lines and provides AC current to the respective motor over high voltage phase lines 29 and 31. In regeneration control, the respective inverter receives AC current from the motor over high voltage phase lines 29 and 31 and provides current to the DC lines 27. The net DC current provided to or from the inverters determines the charge or discharge operating mode of the BPM 21. Preferably, $M_A$ and $M_B$ are three-phase AC electric machines and the inverters comprise complementary three-phase power electronics. Individual motor speed signals Na and Nb for $M_A$ and $M_B$, respectively, are also derived by the DPIM 19 from the motor phase information or conventional rotation sensors. Such motors, electronics, controls and quantities are generally well known to those skilled in the art and further detailed exposition thereof is not required herein.

System controller 43 is a microprocessor based controller comprising such common elements as microprocessor, read only memory ROM, random access memory RAM, electrically programmable read only memory EPROM, high speed clock, analog to digital (A/D) and digital to analog (D/A) circuitry, digital signal processor (DSP), and input/output circuitry and devices (I/O) and appropriate signal conditioning and buffer circuitry. In the exemplary embodiment, system controller 43 comprises a pair of microprocessor based controllers designated as vehicle control module (VCM) 15 and transmission control module (TCM) 17. VCM 15 and TCM 17 may provide, for example, a variety of control and diagnostic functions related to EVT and vehicle chassis including, for example, engine torque commands, input speed control, and output torque control in coordination with regenerative braking, anti-lock braking and traction control, as described herein. Particularly with respect to EVT functionality, system controller 43 functions to directly acquire data from a variety of sensors and directly control a variety of actuators, respectively, of the EVT over a plurality of discrete lines. For simplicity, system controller 43 is shown generally in bi-directional interface with EVT via aggregate line 33. Of particular note, system controller 43 receives frequency signals from rotation sensors for processing into input member 12 speed Ni and output member 64 speed No for use in the control of EVT 10. System controller 43 may also receive and process pressure signals from pressure switches (not separately illustrated) for monitoring clutch C1 and C2 application chamber pressures. Alternatively, pressure transducers for wide range pressure monitoring may be employed. PWM and/or binary control signals are provided by system controller to EVT 10 for controlling fill and drain of clutches C1 and C2 for application and release thereof. Additionally, system controller 43 may receive transmission fluid sump 37 temperature data, such as from conventional thermocouple input (not separately illustrated) to derive sump temperature Ts and provide a PWM signal which may be derived from input speed Ni and sump temperature Ts for control of line pressure via regulator 39. Fill and drain of clutches C1 and C2 are effectuated by way of solenoid controlled spool valves responsive to PWM and binary control signals as alluded to above. Similarly, line pressure regulator 39 may be of a solenoid controlled variety for establishing regulated line pressure in accordance with the described PWM signal. Such line pressure controls are generally well known to those skilled in the art. Clutch slip speeds across clutches C1 and C2 are derived from output speed No, $M_A$ speed Na and $M_B$ speed Nb; specifically, C1 slip is a function of No and Nb, whereas C2 slip is a function of No, Na and Nb. Also illustrated is user interface (UI) block 13 which comprises such inputs to system controller 43 such as vehicle throttle position, push button shift selector (PBSS) for available drive range selection, brake effort and fast idle requests among others. System controller 43 determines a torque command Te_cmd and provides it to ECM 23. Torque command Te_cmd is representative of the EVT torque contribution desired from the engine as determined by the system controller.

The various modules described (i.e. system controller 43, DPIM 19, BPM 21, ECM 23) communicate via controller area network (CAN) bus 25. The CAN bus 25 allows for communication of control parameters and commands between the various modules. The specific communication protocol utilized will be application specific. For example, the preferred protocol for heavy duty applications is the Society of Automotive Engineers standard J1939 (SAE J1939). The CAN bus and appropriate protocols provide for robust messaging and multi-controller interfacing between the system controller, ECM, DPIM, BPIM and other controllers such as antilock brake and traction controllers.

Figure 3:
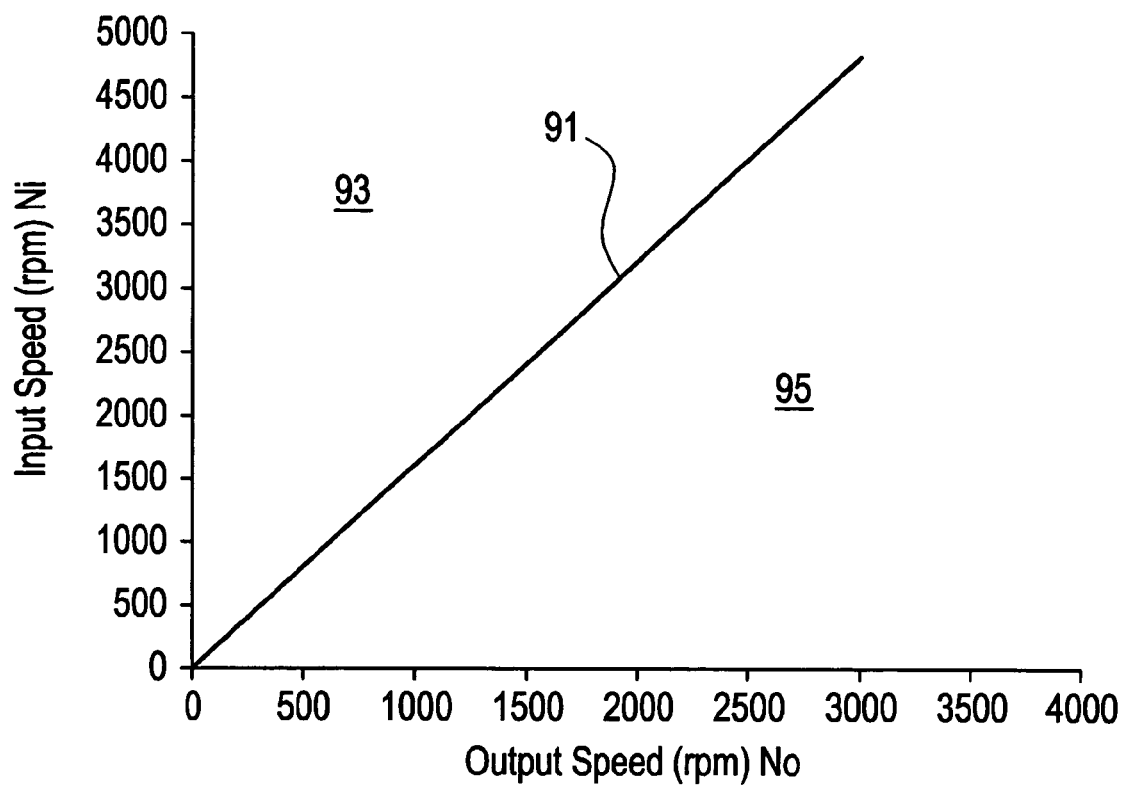
FIG. 3 is a graphical representation of various regions of operation with respect to input and output speeds of the exemplary EVT disclosed herein.

With reference to FIG. 3, a plot of output speed No along the horizontal axis versus input speed Ni across the vertical axis for the EVT 10 is illustrated. Synchronous operation, that is the input speed and output speed relationships whereat both clutch C1 and C2 are operating simultaneously with substantially zero slip speed thereacross is represented by line 91. As such, it represents the input and output speed relationships substantially whereat synchronous shifting from between modes can occur or whereat direct mechanical coupling from input to output can be affected by simultaneous application of both clutches C1 and C2, also known as fixed-ratio. One particular gearset relationship capable of producing the synchronous operation depicted by line 91 in FIG. 3 is as follows: outer gear member 30 having 91 teeth, inner gear member 32 having 49 teeth, planet gear members 34 having 21 teeth; outer gear member 38 having 91 teeth, inner gear member 40 having 49 teeth, planet gear members 42 having 21 teeth; outer gear member 46 having 89 teeth, inner gear member 48 having 31 teeth, planet gear members 50 having 29 teeth. Line 91 may be variously referred to herein as synchronous line, shift ratio line or fixed-ratio line.

To the left of the shift ratio line 91 is a preferred region of operation 93 for the first mode wherein C1 is applied and C2 is released. To the right of the shift ratio line 91 is a preferred region of operation 95 for the second mode wherein C1 is released and C2 is applied. When used herein with respect to clutches C1 and C2, the term applied indicates substantial torque transfer capacity across the respective clutch while the term released indicates insubstantial torque transfer capacity across the respective clutch. Since it is generally preferred to cause shifts from one mode to the other to occur synchronously, torque transfers from one mode into the other mode are caused to occur through a two clutch application fixed ratio wherein, for a finite period prior to the release of the presently applied clutch, the presently released clutch is applied. And, the mode change is completed when fixed-ratio is exited by the continued application of the clutch associated with the mode being entered and the release of the clutch associated with the mode being exited. While region of operation 93 is generally preferred for the operation of the EVT in MODE 1, it is not meant to imply that MODE 2 operation of the EVT cannot or does not occur therein. Generally, however, it is preferred to operate in MODE 1 in region 93 because MODE 1 preferably employs gearsets and motor hardware particularly well suited in various aspects (e.g. mass, size, cost, inertial capabilities, etc.) to the high launch torques of region 95. Similarly, while region of operation 95 is generally preferred for the operation of the EVT in MODE 2, it is not meant to imply that MODE 1 operation of the EVT cannot or does not occur therein. Generally, however, it is preferred to operate in MODE 2 in region 95 because MODE 2 preferably employs gearsets and motor hardware particularly well suited in various aspects (e.g., mass, size, cost, inertial capabilities, etc.) to the high speeds of region 95. A shift into MODE 1 is considered a downshift and is associated with a higher gear ratio in accordance with the relationship of Ni/No. Likewise, a shift into MODE 2 is considered an upshift and is associated with a lower gear ratio in accordance with the relationship of Ni/No.

For transmission speed control during MODE 1 and MODE 2 the dynamic equations for the EVT are determined using Newton's law applicable to rotating bodies:

$$N\_dot = (1/J)*Tsum$$

where

N_dot is rotational acceleration;

J is rotational inertia; and,

Tsum is summation of external torques acting upon inertia J.

In the exemplary EVT, the following matrix equations, determined using Newton's law for each independent free body diagram, correspond to MODE 1 and MODE 2, respectively:

$$[Ni\_dot\ No\_dot]^T = [A1]*[Ti\ Ta\ Tb\ To]^T$$

$$[Ni\_dot\ No\_dot]^T = [A2]*[Ti\ Ta\ Tb\ To]^T$$

where

Ni_dot is input member acceleration;

No_dot is output member acceleration;

Ti is externally applied input member torque;

Ta is externally applied motor A torque;

Tb is externally applied motor B torque;

To is externally applied output member torque; and

A1 and A2 are 2×4 matrices of parametric values determined by the hardware gear and shaft interconnections and estimated hardware inertias applicable to MODE 1 and MODE 2, respectively.

Other different independent member accelerations may be substituted for those shown above to arrive at similar matrix equations. Ni_dot and No_dot are selected as expedient since both input and output speed are quantities of general interest in other areas of the transmission and vehicle controls.

The matrix equation form is identical for MODE 1 and MODE 2. The parametric constants in A1 and A2, however, may differ. Therefore, further references herein to either MODE 1 or MODE 2 shall be equally applicable to the other.

This basic mode model of the system to be controlled provides the basis for transmission input speed control in accordance with the present invention. For the exemplary EVT, it is preferred to perform input speed control via motor torques Ta and Tb and not via the input torque Ti at the input member or via the output torque To at the output member. Thus, Ti and To are both considered as external input or disturbance torques not subject to control by the present invention. Therefore, the basic mode model is rearranged into a matrix equation for solving for motor torques Ta and Tb as follows:

$$[Ta\ Tb]^T = [B1]*[Ti\ To\ Ni\_dot\ No\_dot]^T$$

where B1 is a 2×4 matrix of parametric values determined by the hardware gear and shaft interconnections and estimated hardware inertias applicable to MODE 1 and represents what is commonly referred to as the plant model.

This modified mode model is utilized in the EVT speed control of the present invention. The motor torque commands are calculated based upon the plant dynamic model parameters, B1, and specially formulated inputs (Ti, To, Ni_dot, No_dot) to the model. The choices of application for each of these specially formulated inputs are described below.

Figure 4:
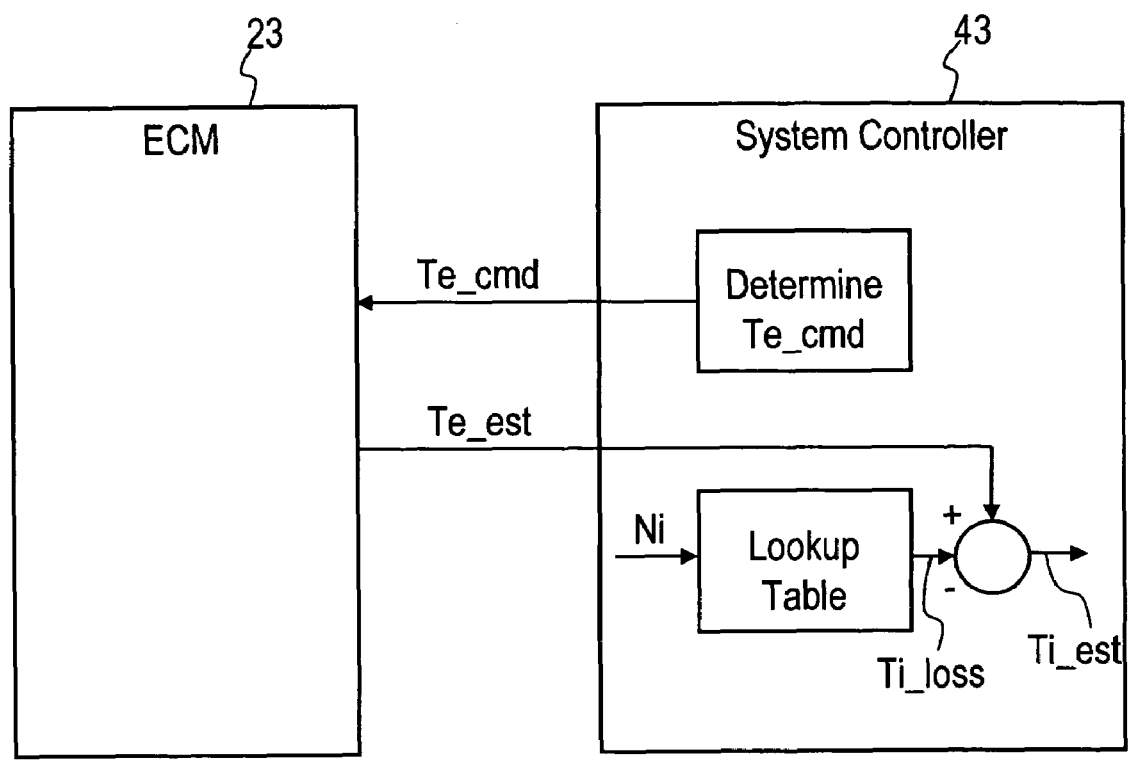
FIG. 4 is a block diagram of EVT input member torque estimation for use in the input speed control of the present invention.

The preferred implementation for input member torque Ti is to provide an estimated input torque, Ti_est, for Ti. FIG. 4 provides a block diagram of the method by which estimated input torque Ti_est is determined. An engine torque command, Te_cmd is provided to ECM 23 by the system controller 43. The ECM 23 then provides an estimate of the actual engine torque produced, Te_est, which is provided to the system controller 43. The system controller 43 then calculates an estimate of torque losses to the input member, Ti_loss, through the use of an empirically defined lookup table which is a function of input member speed, Ni. These empirically defined losses represent reductions in torque produced by the engine due to friction, transmission pump losses, engine driven accessories, etc. The engine's estimate of torque produced is then reduced by the loss estimate to calculate the estimated input torque, Ti_est. Through Ti_est, Ta and Tb are calculated in such a manner as to account for and counteract the effects of estimated transmission input torque on transmission input speed.

The preferred implementation for output member torque To is to provide a desired output torque to be produced by the transmission, To_des for To. In the modified model utilized in the EVT input speed control described herein, To is considered an external torque acting upon the output member. The external output torque is assumed equal and opposite to the EVT produced output torque and hence To is equated to To_des. The determination of To_des is made based upon several factors such as driver inputs of accelerator pedal position, brake pedal position, shift selector position; vehicle dynamic conditions such as acceleration rate or deceleration rate; EVT operational conditions such as temperatures, voltages, currents and speeds.

To_des may also comprise the system constrained output torque target for the control. It may correspond to the torque requested by the vehicle operator in the event that the request is within the system's capabilities. But it may correspond to a constrained output torque which is commanded to system in accordance with system limits. To_des may also be constrained in accordance with other factors apart from system capabilities such as vehicle driveability and stability considerations. Constrained output torques may be determined in accordance with minimum and maximum input torque capabilities at present operating conditions (Ti_min, Ti_max), minimum and maximum motor torques at present operating conditions (Ta_min, Ta_max, Tb_min, Tb_max) and minimum and maximum battery power capabilities at present operating conditions (Pbatt_Min, Pbatt_max).

Through To or To_des, Ta and Tb are calculated, as well as Te as described above, and provided to their respective controller or controllers for implementation of the necessary control commands, Ta_cmd, Tb_cmd and Te_cmd, respectively, in such a manner as to produce the desired transmission output torque. To_des may be referred to herein as a command or To_cmd, even though it may exist primarily as an intermediate value and be resolved into control commands associated Ta, Tb and Te, namely Ta_cmd, Tb_cmd and Te_cmd, as described below. Additional details related to the operation of powertrain system 11 and the determination of control commands associated Ta, Tb and Te may be found in related, commonly assigned, co-pending U.S. Ser. No. 10/686,511 filed on Oct. 14, 2003 and Ser. No. 10/779,531 filed on Feb. 14, 2004, which are incorporated herein by reference in their entirety.

As described briefly above, it is desirable to perform diagnostic tests on $M_A$ and $M_B$ at key-on prior to attempting to implement their respective torque commands, Ta_cmd and Tb_cmd, in order to determine their integrity or status with respect to their ability to implement these commands. For example, in the event that changes in the configuration and/or condition of the motor or motor encoder wiring of either of the motors have occurred since the previous key-off, or other changes such as the development of a high friction path in the motor mechanism or another portion of the driveline that is operably and selectively coupled to the motor, or other system changes, it is desirable to test the motors using a brief torque command to determine whether each of the motors is capable of producing the motor torques necessary to operate the system within normal operational parameters. It is particularly desirable to test the motors without the need to add additional hardware to either of the motors or other elements of the system. The present invention is advantageous in that it provides such a diagnostic test of the motor torque integrity of the electric motor, or in the case where a plurality of electric motors are utilized, for each of the electric motors. It is also advantageous in that it may be implemented without the need for the addition of hardware beyond that already utilized in an HEV powertrain system, such as powertrain system 11.

Figure 5:
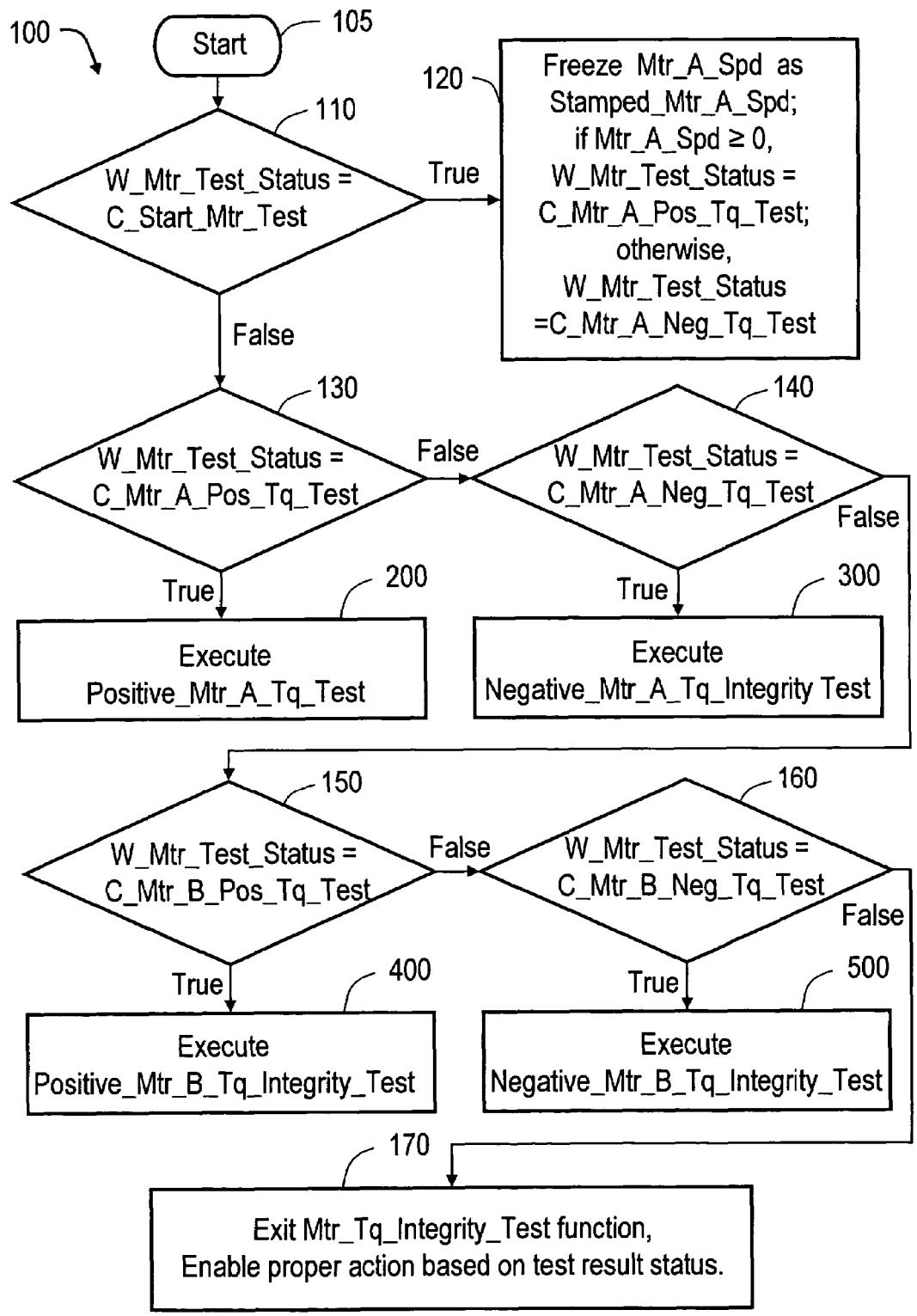
FIG. 5 is a flowchart of the method of the present invention.
Figure 6:
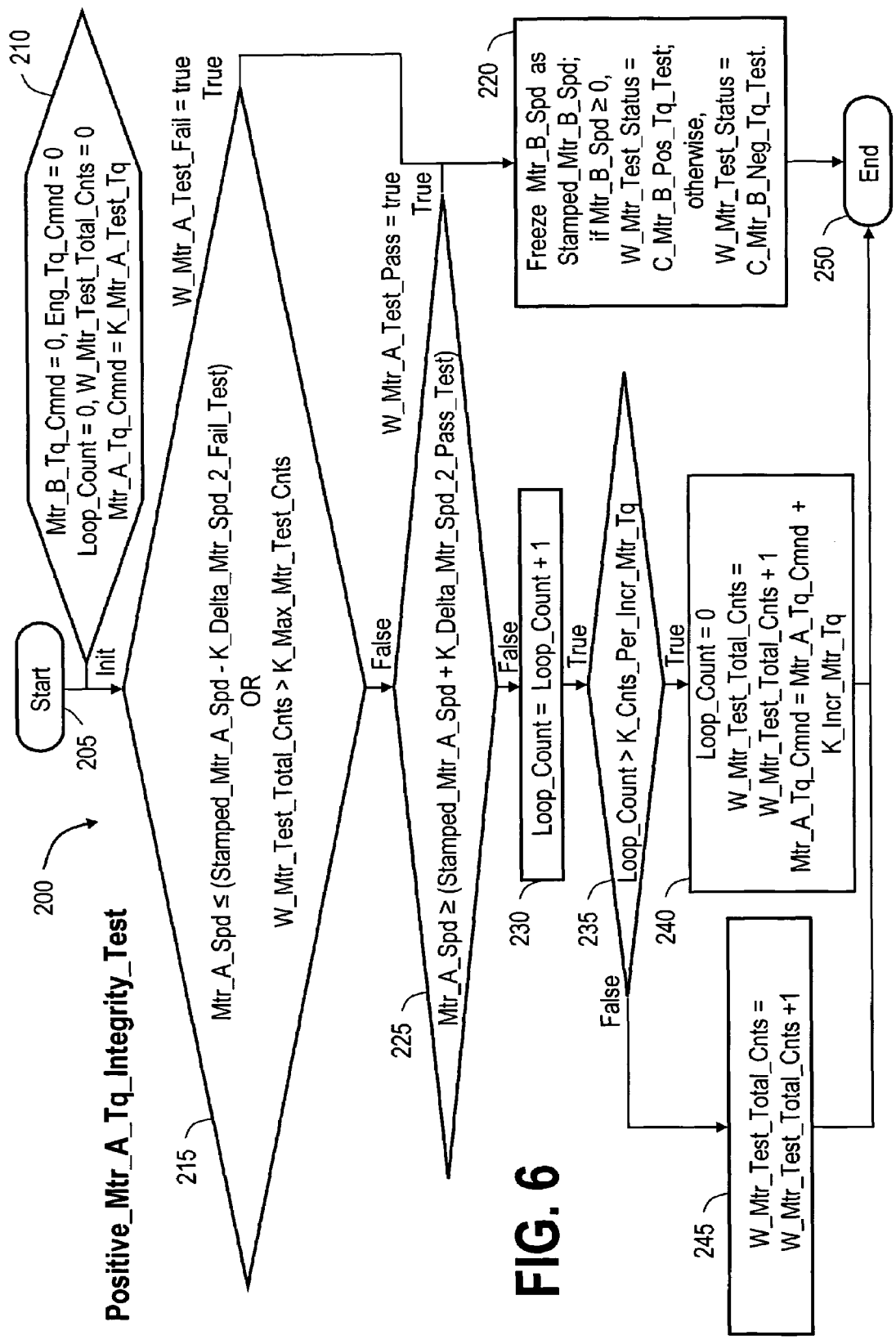
FIG. 6 is a flow chart of block 200 of FIG. 2.
Figure 7:
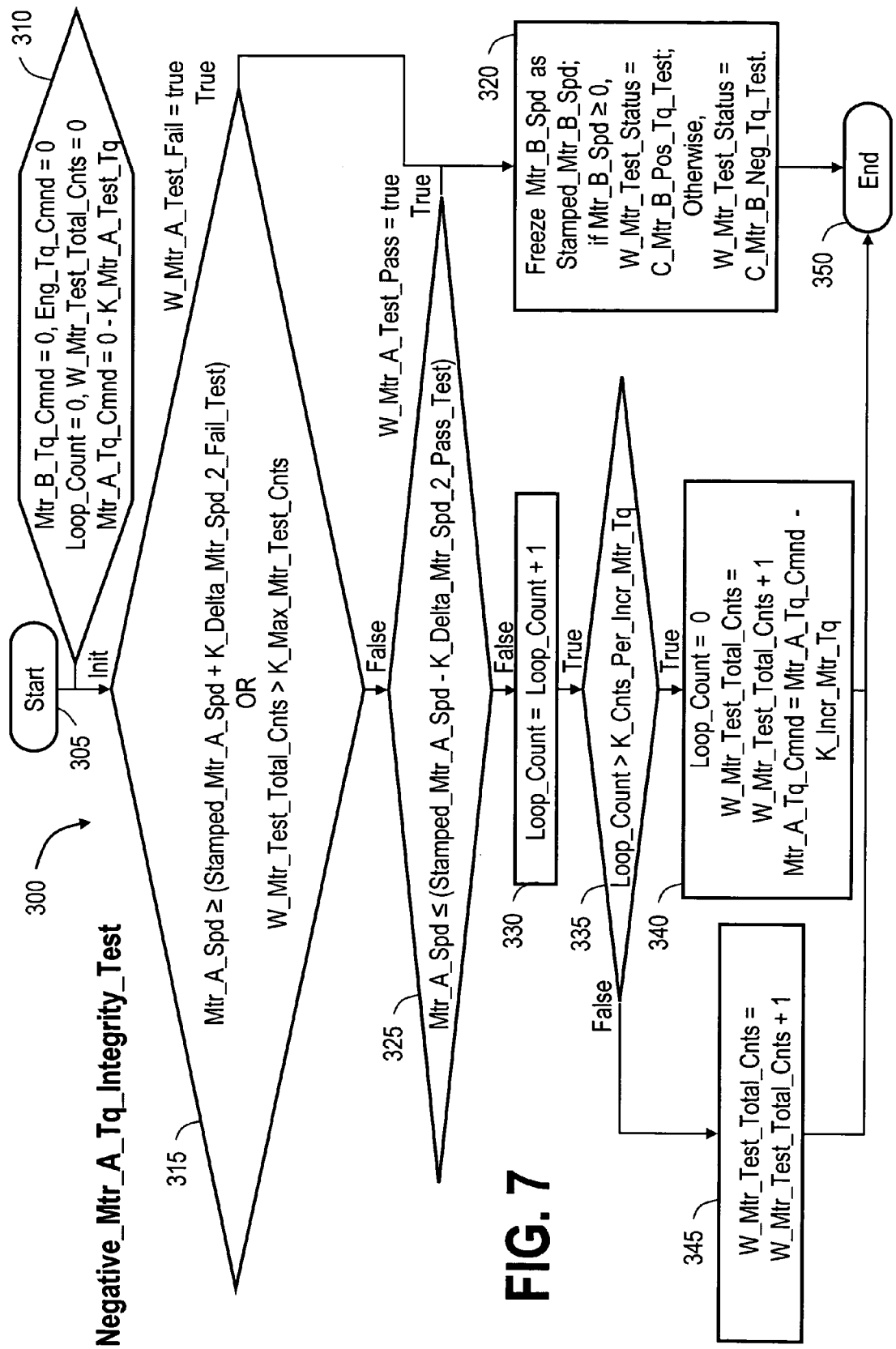
FIG. 7 is a flow chart of block 300 of FIG. 2.

Referring to FIGS. 5-9, the present invention is a method 100 of testing an electric motor that is adapted to provide a desired electric motor output torque to a vehicle powertrain system comprising an engine and the electric motor which are operatively and selectively coupled to a transmission, comprising the steps of determining an initial motor speed of the electric motor as illustrated, for example, in blocks 120, 220 and 320 of FIGS. 5-7, respectively; determining a motor torque command as a function of the initial motor speed, as illustrated, for example, in blocks 210, 310, 410, 510 of FIGS. 6-9, respectively; applying the motor torque command to the electric drive motor to produce an output torque from the electric drive motor, as illustrated, for example, in blocks 210, 310, 410 and 510 of FIGS. 6-9, respectively; measuring a resultant motor speed of the electric drive motor, as illustrated, for example, in blocks 215/225, 315/325, 415/425 and 515/525 of FIGS. 6-9, respectively; and establishing a motor status as a function of the resultant motor speed, as illustrated, for example, in blocks 215/225, 315/325, 415/425 and 515/525 of FIGS. 6-9, respectively. It is believed that method 100 may be implemented either in hardware, such as, for example, using various forms of hardwired logic and or computational elements, or in software, or in various combinations thereof. However, it is preferred that method 100 comprise a computer control algorithm which may be stored and executed as computer code in one or more computers located in the vehicle, such as found in system controller 43. The controller, such as system controller 43, is either adapted to receive various needed inputs (e.g., Mtr_A_Spd and Mtr_B_Spd) directly or obtain them from other controllers of the system (e.g., ECM 23) via controller bus 25 and provide them in conjunction with the implementation of method 100, as described herein. The controller, such as system controller 43, is also adapted to set certain status flags or other indications in conjunction with the execution or performance of method 100. The steps of the invention are described in further detail below.

The terms and variable names used in the flowcharts of FIGS. 5-9 have the following definitions:

| | |
|---|---|
| Eng_Tq_Cmnd | Engine fuel torque command (%); |
| K_Delta_Mtr_Spd_2_Pass_Test | Criteria of motor speed increment to pass motor torque integrity test (e.g., 50 rpm); |
| K_Delta_Mtr_Spd_2_Fail_Test | Criteria of motor speed increment to fail motor torque integrity test (e.g., 300 rpm); |
| K_Incr_Mtr_Tq | Motor torque command increased after K_Cnts_Per_Incr_Mtr_Tq counts before it passes the test (e.g., 20 n-m if Ts ≧ 10° C., and 30 n-m if Ts < 10° C.; |
| K_Max_Mtr_Test_Cnts | Maximum counts to perform motor A/B torque integrity test; |
| K_Mtr_A_Test_Tq | Motor A starting torque command when positive motor A torque integrity test is initialized and triggered (e.g., 40 n-m); |

-continued

| | |
|---|---|
| K_Mtr_B_Test_Tq | Motor B starting torque command when positive motor B torque integrity test is initialized and triggered (e.g., 50 n-m); |
| Mtr_A_Spd | Current motor A speed (rpm); |
| Mtr_A_Tq_Cmnd | Motor A torque command (Nm); |
| Mtr_B_Spd | Current motor B speed (rpm); |
| Mtr_B_Tq_Cmnd | Motor B torque command (Nm); |
| Stamped_Mtr_A_Spd | Motor A starting speed when motor A torque integrity test is initialized and triggered; |
| Stamped_Mtr_B_Spd | Motor B starting speed when motor B torque integrity test is initialized and triggered; |
| W_Mtr_Test_Status | Status indicator or flag used to track and direct motor torque integrity test sequence, permissible values include: C_Start_Mtr_Test, C_Mtr_A_Pos_Tq_Test, C_Mtr_A_Neg_Tq_Test C_Mtr_B_Pos_Tq_Test, C_Mtr_B_Neg_Tq_Test, and C_End_Mtr_Test; and |
| W_Mtr_Test_Total_Cnts | Test duration (based on the number of counts of a counter) of a particular motor test. |

Referring to FIG. 5, method 100 is started as indicated in block 105 in response to a system state change or triggering event for which it is desirable to test the motor torque integrity. This may comprise any appropriate system state change or triggering event, but preferably comprises a key-on or power on signal due to actuation of a keyswitch or other well-known signal actuation means. The key-on signal is provided to controller, such as system controller 43, and its presence may be used as a trigger to execute a computer program or programs to perform the steps of method 100. The program is preferably executed repetitively in conjunction with a plurality of control loops of controller, and the status of certain flags and variables are updated in a given control loop and stored for use in subsequent control loops using well-known methods.

Referring again to FIG. 6, the test status variable, W_Mtr_Test_Status, is checked in decision block 110 to see if it is equal to C_Start_Mtr_Test, if true, method 100 proceeds to block 120, and if false (i.e., if the program has already begun execution and a different value has been assigned) the method proceeds to decision block 130. Therefore, in the initial loop through the program, block 120 is selected, wherein several actions are taken. First, the value of the current motor speed of the motor to be tested, Mtr_A_Spd, is frozen and stored as Stamped Mtr_A_Spd. This is the step of determining an initial motor speed of the electric motor. While the determination of the initial motor speed is explained in this example with respect to motor A, in the case where vehicle powertrain system comprises a plurality of electric motors, the order of testing may be any desired order and is a matter of design choice made in conjunction with a particular embodiment of the invention. Referring again to block 120, secondly, if the Mtr_A_Spd is greater than or equal to zero, the value of W_Mtr_Test_Status is set equal to C_Mtr_A_Pos_Tq_Test; and if otherwise (i.e., less than zero), is set equal to C_Mtr_A_Neg_Tq_Test, and is stored by the controller. This determination of the value of W_Mtr_Test_Status as a function of the initial motor speed and certain of the test steps which follow therefrom comprise determining a motor torque command as a function of the initial motor speed. Once the initial program loop and the steps described above have been completed, the program continues to execute in conjunction with subsequent control loops using certain status flag and fixed values stored during prior control loops, as described herein.

Referring again to block 110 of FIG. 6, following the initial loop, the value of W_Mtr_Test_Status does not equal C_Start_Mtr_Test, but rather, in the example given, has been set equal to C_Mtr_A_Pos_Tq_Test or C_Mtr_A_Neg_Tq_Test depending on the value of Mtr_A_Spd (or if the testing of motor A has been completed on other values of W_Mtr_Test_Status as described herein), such that the test result of decision block 110 is false, and the method passes to decision block 130. In block 130, the method tests to determine if W_Mtr_Test_Status is equal to C_Mtr_A_Pos_Tq_Test, true passes to block 200 to execute the sequence of steps associated with a routine for Positive_Mtr_A_Tq_Test, and if false, passes to decision block 140 to determine if W_Mtr_Test_Status is equal to C_Mtr_A_Neg_Tq_Test, and if true passes to block 300 to execute the sequence of steps associated with a routine for Negative_Mtr_A_Tq_Test, and if false the method proceeds to block 150. This is simply a means of determining whether to perform the testing of motor A using a positive torque command or a negative torque command. If the initial speed, Stamped_Mtr_A_Spd, is positive with respect to a common rotational reference, the test utilizes a positive torque command, or a torque command that is applied in the same direction that the motor is rotating. If the initial speed, Stamped_Mtr_A_Spd, is negative with respect to a common rotational reference, the test utilizes a negative torque command, or a torque command which is again applied in the same direction that the motor under test is rotating.

Referring again to FIGS. 6-7, once the testing of motor A is complete, the value of W_Mtr_Test_Status will not be equal to C_Mtr_A_Pos_Tq_Test or C_Mtr_A_Neg_Tq_Test, but will have been set in accordance with one of blocks 220 or 320 of FIGS. 6 and 7, respectively, thus the result of the test of block 140 will be false, and method 100 proceeds to block 150. In block 150, the method tests to determine if W_Mtr_Test_Status is equal to C_Mtr_B_Pos_Tq_Test, and if true passes to block 400 to execute the sequence of steps associated with a routine for Positive_Mtr_B_Tq_Test, and if false, passes to decision block 160 to determine if W_Mtr_Test_Status is equal to C_Mtr_B_Neg_Tq_Test, and if true passes to block 500 to execute the sequence of steps associated with a routine for Negative_Mtr_B_Tq_Test, and if false the method proceeds to block 170. This is simply a means of determining whether to perform the testing of motor B using a positive torque command or a negative torque command. If the initial speed, Stamped_Mtr_B_Spd (see block 220 or block 320 of FIG. 6 or 7, respectively), is positive with respect to a rotational reference, the test utilizes a positive torque command, or a torque command that is applied in the same direction that the motor is rotating. If the initial speed, Stamped_Mtr_B_Spd, is negative with respect to a rotational reference, the test utilizes a negative torque command, or a torque command which is again applied in the same direction that the motor under test is rotating. This general approach can be extended in cases where the plurality of electric motors is a number larger than two by the appropriate addition of analogous steps for each of the additional motors. Once the tests have been completed for all of the motors, the value of W_Mtr_Test_Status is set equal to C_End_Mtr_Test and the motor torque integrity diagnostic routine is completed. The values of the status associated with each of the motors tested may then be passed to the controller for subsequent control actions in accordance with the results of the test. For example, if the status of all motors is PASS, as described herein, the control action may be to enable propulsion using all of the electric motors. If the status of one or more of the motors is FAIL, as described herein, the control action may be, for example, to disable propulsion using the motor which has failed the test or other motors that may be affected thereby. If the status of all of the motors is FAIL, as described herein, the control action may be, for example, to disable propulsion using electric motors altogether.

Referring to FIGS. 5 and 6, if the W_Mtr_Status variable is set to C_Mtr_A_Pos_Tq_Test in the manner described above, the positive torque testing of motor A is selected, and method 10 proceeds to block 200 and the execution of the motor A positive torque test. Referring to FIG. 6, in the embodiment of method 100 described herein, the steps associated with block 200 comprise a routine or subroutine of the program of method 100 associated with a positive torque test of motor A. The routine is triggered or started as indicated in block 205 in response to the selection of block 200 for execution, as described herein. The routine is adapted to loop in conjunction with the actions of the controller as described above. On the first loop of the program, an initialization of certain values and variables associated with the routine occurs, as well as the implementation of control of certain elements of the system based on the initialized values. The initialization comprises setting the motor B torque command, Mtr_B_Tq_Cmnd, to zero and implementing control of motor B based on the motor B torque command, setting the engine torque command, Eng_Tq_Cmnd, to zero and implementing control of the engine based on the engine torque command, setting loop count counter, Loop_Count, to zero, and setting the value of the motor A torque command, Mtr_A_Tq_Cmnd, equal to a predetermined positive torque command, K_Mtr_A_Test_Tq, and implementing control of motor A based on the motor A torque command. This command is preferably applied for the duration of the test of motor A, or the particular motor under test. This comprises the step of applying the motor torque command to the electric motor to produce an output torque from the electric motor. The command of K_Mtr_A_Test_Tq is intended to either cause the rotation of motor A and a resultant positive motor speed if the Mtr_A_Spd prior to the command is zero, or increase the Mtr_A_Spd if this speed is greater than zero to a resultant positive motor speed. However, it is possible that issues related to the motor wiring or encoder wiring may prevent the intended result. Therefore, method 100 also comprises a step of measuring a resultant motor speed of the electric motor to determine if the expected incremental change in motor speed has occurred in response to the torque command. Referring again to block 215 of FIG. 6, if the resultant or current motor speed, Mtr_A_Spd, is less than or equal to the initial motor speed, Stamped Mtr_A_Spd, minus a first predetermined limit value, K_Delta_Mtr_Spd_2_Fail_Test, the test result is true, or in other words if the positive motor speed decreases (i.e., becomes less positive or negative) in response to the torque command by more than a predetermined speed increment, the test result is true and the status is determined to be FAIL, because the speed response of the motor is outside the parametric limits of expected motor speed response to the known torque command. This may be described with respect to method 100 as a step of determining whether the resultant motor speed is less than or equal to the initial motor speed less a first predetermined limit value, wherein if the resultant motor speed is less than or equal to the initial motor speed less the first predetermined limit value, the motor status is set to a FAIL status. In this embodiment, block 215 also incorporates a second check to determine whether the duration of the test of motor A, W_Mtr_Test_Total_Cnts, has exceeded (is greater than) a predetermined motor test duration limit, K_Max_Mtr_Test_Cnts, which may also be expressed as a motor test cycle limit. This is utilized to limit the duration of additional testing of motor A if the PASS/FAIL status is indeterminate after the initial tests of block 215 and 225, as explained more fully below. If this condition is true, the status of the test of motor A is also determined to be FAIL. In the embodiment shown, the tests are linked with a conditional OR statement, so if either of the tests is true, the test status or result is FAIL and this routine of method 100 passes to block 220 and the testing of subsequent motors if system 11 comprises a plurality of motors, otherwise, method 100 is complete. If the outcome of both of the tests of block 215 is false, the routine passes to block 225 and an additional test of the speed of motor A, namely whether the resultant or current motor speed, Mtr_A_Spd, is greater than or equal to the initial motor speed, Stamped Mtr_A_Spd, plus a second predetermined limit value, K_Delta_Mtr_Spd_2_Fail_Test, is true, or in other words if the motor speed increases in response to the torque command by more than a predetermined speed increment. If the result of the test is true, the test status is determined to be PASS because the speed response of the motor is within the parametric limits of expected motor speed response to the known torque command. This may be described with respect to method 100 as a step of determining whether the resultant motor speed is greater than or equal to the initial motor speed plus a second predetermined limit value, wherein if the resultant motor speed is greater than or equal to the initial motor speed plus the second predetermined limit value, the motor status is set to a PASS status. If the result of the test of block 225 are false, and thus the status of the test is neither PASS nor FAIL, the test is indeterminate and this routine of method 100 continues to block 230, wherein the Loop_Count is incremented and stored in conjunction with a means of extending the test of motor A, and the test continues to block 235. In decision block 235, the test of whether the Loop_Count is greater than K_Cnts_Per_Incr_Mtr_Tq is performed, wherein if the result of the test is false, method 100 passes to block 245 to increment the counter associated with the duration of the test of motor A, W_Mtr_Test_Total_Counts, whereupon method 100 passes to block 250 and the end of the test for that control loop, whereupon method 100 and the routine of block 200 is executed in a subsequent control loop. In effect, blocks 230, 235, 245 and 250 work together to implement a predetermined delay interval prior to incrementing the torque command during the additional testing of motor A, if the current status of the test is indeterminate (i.e., neither PASS nor FAIL). Once this delay is achieved, and the result of decision block 235 is true, method passes to block 240. In block 240 the following occurs: the Loop_Count is reset to zero; the counter associated with the duration of the test of motor A, W_Mtr_Test_Total_Counts, is incremented; a revised Mtr_A_Tq_Cmnd is determined by taking the current value of the Mtr_A_Tq_Cmnd and incrementing it by adding the predetermined torque increment, K_Incr_Mtr_Tq. This may be described with respect to method 100 as a step wherein, if the motor status is neither PASS nor FAIL, determining a revised motor torque command by incrementing the motor torque command by a predetermined torque increment. The revised motor torque command is passed to motor A, which may be described with respect to method 100 as a step of applying the revised motor torque command to the electric motor to produce a corresponding revised output torque from the electric motor. Method 100 then passes to block 250 and the end of the block 200 routine associated with that control loop. In subsequent control loops, method 100 will return to block 200 and repeat the control logic therein and the tests of blocks 215 and 225 to test the effect of the application of the revised motor torque on the resultant motor speed by examining the revised resultant motor speed. These tests will compare the revised resultant motor speed to the limits described above in the manner described above until the status of motor A is determined to be PASS or FAIL. This may be described with respect to method 100 as the steps of: determining a revised resultant motor speed of the electric motor; determining whether the revised resultant motor speed is greater than or equal to the initial motor speed plus a first predetermined limit value, wherein if the revised resultant motor speed is greater than or equal to the initial motor speed plus a first predetermined limit value, the motor status is set to a FAIL status; determining whether the revised resultant motor speed is less than or equal to the initial motor speed less a second predetermined limit value, wherein if the revised resultant motor speed is less than or equal to the initial motor speed less the second predetermined limit value, the motor status is set to a PASS status; and if the motor status is neither PASS nor FAIL, repeating the preceding steps of this claim for a plurality of cycles which is less than or equal to a motor test cycle limit until the test status is determined to be PASS or FAIL or the test cycle limit is attained. This generally comprises the step of establishing a motor status as a function of the resultant motor speed. Once method 100 has been executed sufficiently to ensure that the status of motor A is either PASS or FAIL (i.e., the results of the tests of either block 215 or 235 are true), method 100 proceeds to block 220 and the testing of additional motors, such as motor B, or method 100 is complete and is exited as illustrated in block 170 of FIG. 5.

Referring to FIGS. 5 and 7, if the W_Mtr_Status variable is set to C_Mtr_A_Neg_Tq_Test in the manner described above, the negative torque testing of motor A is selected, and method 10 proceeds to block 300 and the execution of the motor A negative torque test. Referring to FIG. 7, in the embodiment of method 100 described herein, the steps associated with block 300 comprise a routine or subroutine of the program of method 100 associated with a negative torque test of motor A. The routine is triggered or started as indicated in block 305 in response to the selection of block 300 for execution, as described herein. The routine is adapted to loop in conjunction with the actions of the controller as described above. On the first loop of the program, an initialization of certain values and variables associated with the routine occurs, as well as the implementation of control of certain elements of the system based on the initialized values. The initialization comprises setting the motor B torque command, Mtr_B_Tq_Cmnd, to zero and implementing control of motor B based on the motor B torque command, setting the engine torque command, Eng_Tq_Cmnd, to zero and implementing control of the engine based on the engine torque command, setting loop count counter, Loop_Count, to zero, and setting the value of the motor A torque command, Mtr_A_Tq_Cmnd, equal to a predetermined negative torque command, (0-K_Mtr_A_Test_Tq), and implementing control of motor A based on the motor A torque command. This command is preferably applied for the duration of the test of motor A, or the particular motor under test. This comprises the step of applying the motor torque command to the electric motor to produce an output torque from the electric motor. The command of (0-K_Mtr_A_Test_Tq) is intended to decrease the negative Mtr_A_Spd (i.e., increase the speed in the negative direction). However, it is possible that issues related to the motor wiring or encoder wiring may prevent the intended result. Therefore, method 100 also comprises a step of measuring a resultant motor speed of the electric drive motor to determine if the expected incremental change in motor speed has occurred in response to the torque command. Referring again to block 315 of FIG. 7, if the resultant or current motor speed, Mtr_A_Spd, is greater than or equal to the initial motor speed, Stamped Mtr_A_Spd, plus a first predetermined limit value, K_Delta_Mtr_Spd_2_Fail_Test, the test result is true, or in other words if the negative motor speed increases (i.e., becomes less negative or positive) in response to the torque command by more than a predetermined speed increment, the test result is true and the status is determined to be FAIL, because the speed response of the motor is outside the parametric limits of expected motor speed response to the known torque command. This may be described with respect to method 100 as a step of determining whether the resultant motor speed is greater than or equal to the initial motor speed plus a first predetermined limit value, wherein if the resultant motor speed is greater than or equal to the initial motor speed plus the first predetermined limit value, the motor status is set to a FAIL status. In this embodiment, block 315 also incorporates a second check to determine whether the duration of the test of motor A, W_Mtr_Test_Total_Cnts, has exceeded (is greater than) a predetermined motor test duration limit, K_Max_Mtr_Test_Cnts, which may also be expressed as a motor test cycle limit. This is utilized to limit the duration of additional testing of motor A if the status is indeterminate after the initial tests of block 315 and 325, as explained more fully below. If this condition is true, the status of the test of motor A is also determined to be FAIL. In the embodiment shown, the tests are linked with a conditional OR statement, so if either of the tests is true, the test status or result is FAIL and this routine of method 100 passes to block 320 and the testing of subsequent motors if system 11 comprises a plurality of motors, otherwise, method 100 is complete. If the outcome of both of the tests of block 315 are false, the routine passes to block 325 and an additional test of the speed of motor A, namely whether the resultant or current motor speed, Mtr_A_Spd, is less than or equal to the initial motor speed, Stamped Mtr_A_Spd, minus a second predetermined limit value, K_Delta Mtr_Spd_2_Fail_Test, is true, or in other words if the negative motor speed decreases (i.e., becomes more negative) in response to the torque command by more than a predetermined negative speed increment. If the result of the test is true, the test status is determined to be PASS, because the speed response of the motor is within the parametric limits of expected motor speed response to the known torque command. This may be described with respect to method 100 as a step of determining whether the resultant motor speed is less than or equal to the initial motor speed less a second predetermined limit value, wherein if the resultant motor speed is less than or equal to the initial motor speed less the second predetermined limit value, the motor status is set to a PASS status. If the result of the test of block 325 is false, and thus the status of the test is neither PASS nor FAIL, the test is indeterminate and this routine of method 100 continues to block 330, wherein the Loop_Count is incremented and stored in conjunction with a means of extending the test of motor A, and the test continues to block 335. In decision block 335, the test of whether the Loop_Count is greater than K_Cnts_Per_Incr_Mtr_Tq is performed, wherein if the result of the test is false, method 100 passes to block 345 to increment the counter associated with the duration of the test of motor A, W_Mtr_Test_Total_Counts, whereupon method 100 passes to block 350 and the end of the test for that control loop, whereupon method 100 and the routine of block 300 is executed in a subsequent control loop. In effect, blocks 330, 335, 345 and 350 work together to implement a predetermined delay interval prior to additional testing of motor A, if the current status of the test is indeterminate (i.e., neither PASS nor FAIL). Once this delay is achieved, and the result of decision block 335 is true, method passes to block 340. In block 340 the following occurs: the Loop_Count is reset to zero; the counter associated with the duration of the test of motor A, W_Mtr_Test_Total_Counts, is incremented; a revised Mtr_A_Tq_Cmnd for negative torque is determined by taking the current (negative) value of the Mtr_A_Tq_Cmnd and incrementing it by subtracting the predetermined torque increment K_Incr_Mtr_Tq. This may be described with respect to method 100 as a step wherein, if the motor status is neither PASS nor FAIL, determining a revised motor torque command by incrementing the motor torque command by a predetermined torque increment. The revised motor A torque command is passed to motor A to create an additional torque command, which may be described with respect to method 100 as a step of applying the revised motor torque command to the electric motor to produce a corresponding revised output torque from the electric motor. Method 100 then passes to block 350 and the end of the block 300 routine associated with that control loop. In subsequent control loops, method 100 will return to block 300 and repeat the control logic therein and the tests of blocks 315 and 325 to test the effect of the application of the revised motor torque on the resultant motor speed by examining the revised resultant motor speed. These tests will compare the revised resultant motor speed to the limits described above in the manner described above until the status of motor A is determined to be PASS or FAIL. This may be described with respect to method 100 as the steps of: determining a revised resultant motor speed of the electric motor; determining whether the revised resultant motor speed is less than or equal to the initial motor speed less the first predetermined limit value, wherein if the revised resultant motor speed is less than or equal to the initial motor speed less the first predetermined limit value, the motor status is set to a FAIL status; determining whether the revised resultant motor speed is greater than or equal to the initial motor speed plus a second predetermined limit value, wherein if the revised resultant motor speed is greater than or equal to the initial motor speed plus the second predetermined limit value, the motor status is set to a PASS status; and if the motor status is neither PASS nor FAIL, repeating the preceding steps of this claim for a plurality of cycles which is less than or equal to a motor test cycle limit until the motor status is determined to be PASS or FAIL or the test cycle limit is attained (i.e., the test status is determined to be FAIL by not achieving either limit). This generally comprises the step of establishing a motor status as a function of the resultant motor speed. Once method 100 has been executed sufficiently to ensure that the status of motor A is either PASS or FAIL (i.e., the results of the tests of either block 315 or 335 are true), method 100 proceeds to block 320 and the testing of additional motors, such as motor B, or method 100 is complete and is exited as illustrated in block 170 of FIG. 5.

Figure 8:
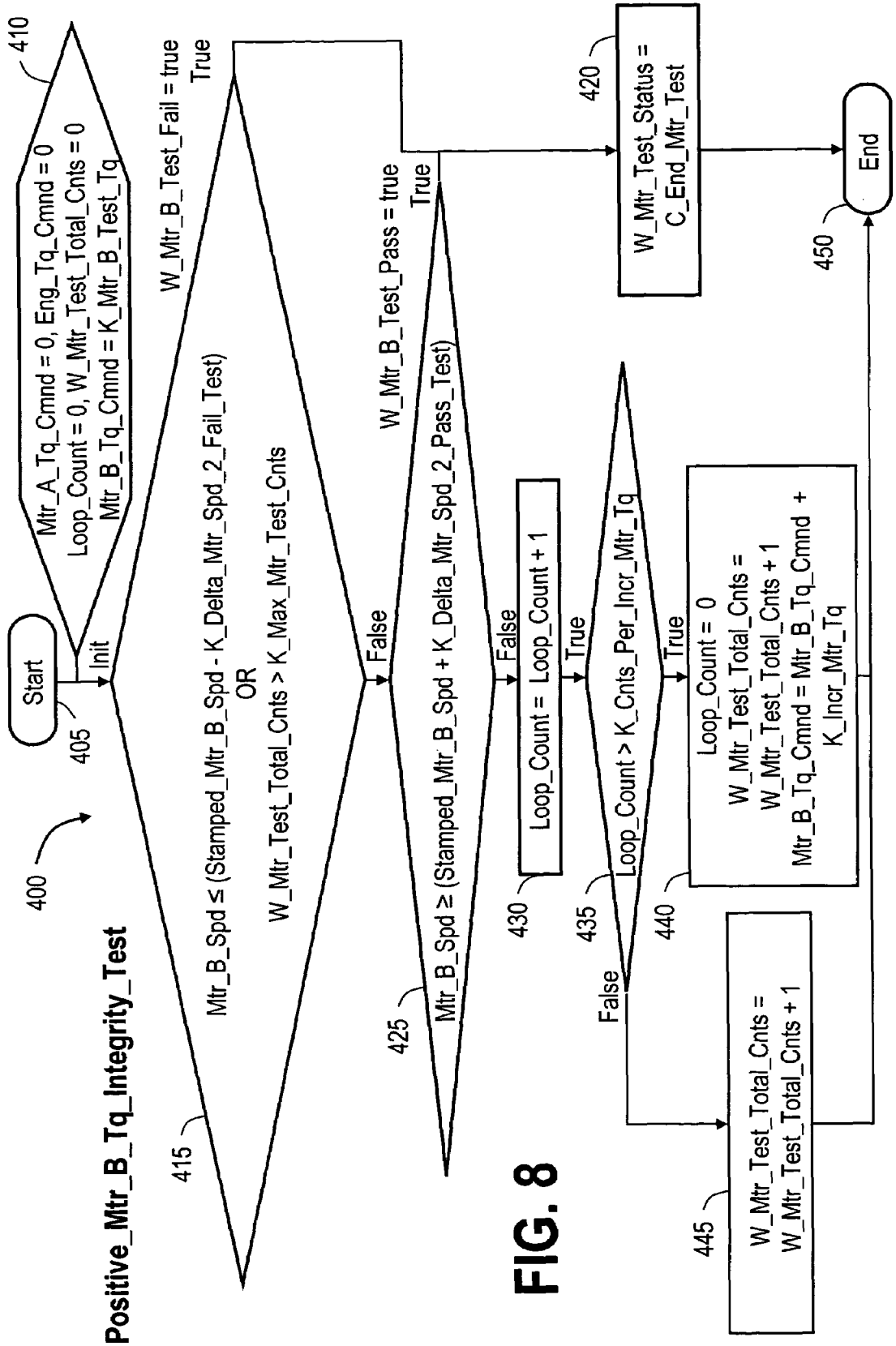
FIG. 8 is a flow chart of block 400 of FIG. 2.
Figure 9:
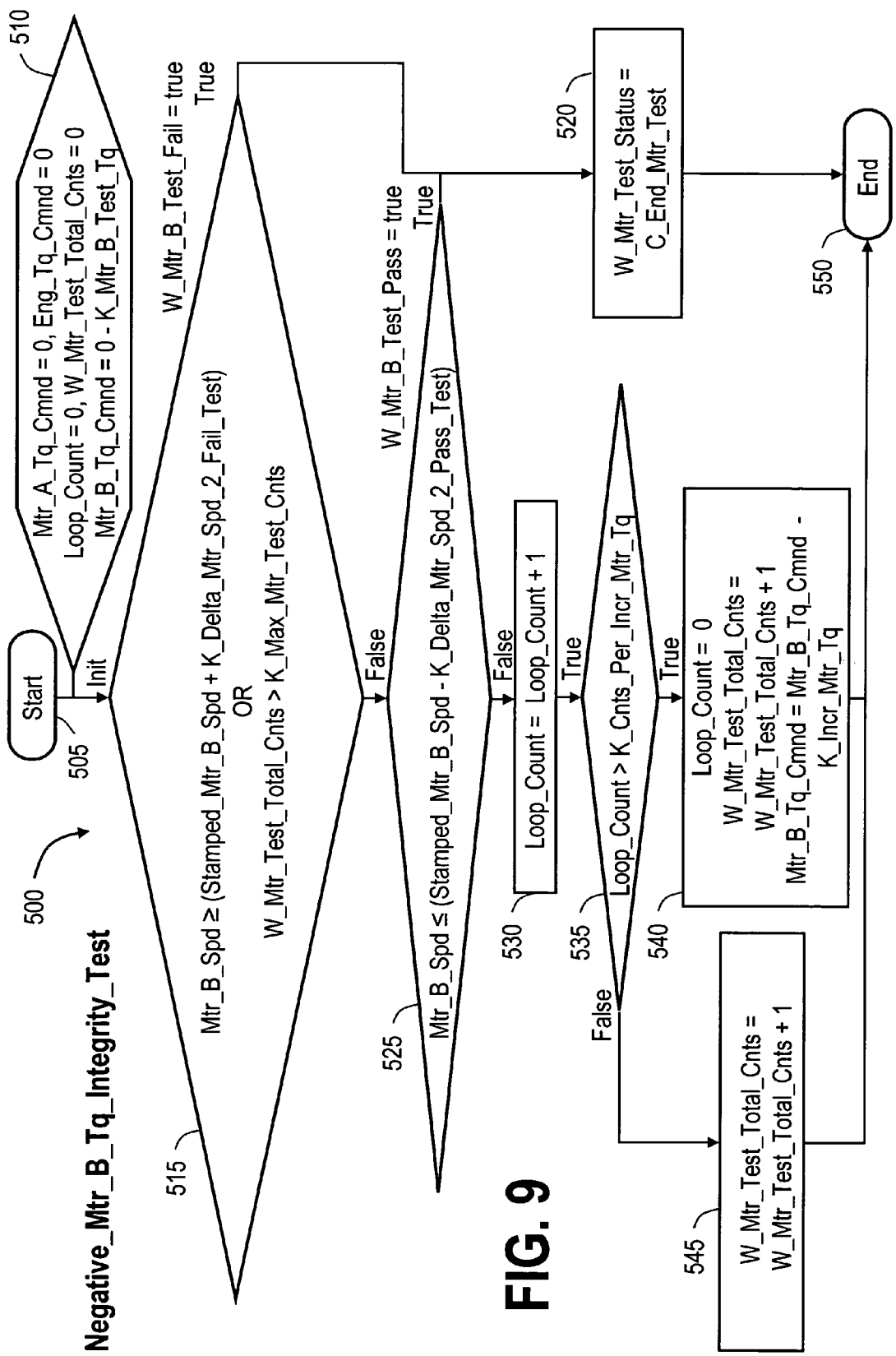
FIG. 9 is a flow chart of block 500 of FIG. 2.

If the vehicle powertrain system comprises a plurality of electric motors, such as powertrain system 11, once the testing of the first motor, such as motor A, is complete and a status has been determined, such as PASS or FAIL, as described above, method 100 proceeds to either block 220 or block 320 of FIGS. 6 and 7, respectively, depending on whether the test of the first motor was a positive or negative torque integrity test. Both blocks 220 and 320 perform identical functions which are entirely analogous to those performed with respect to block 120. First, the value of the current motor speed of the motor to be tested, Mtr_B_Spd, is frozen and stored as Stamped Mtr_B_Spd. This is the step of determining an initial motor speed of the electric motor with respect to motor B. Referring again to block 120, secondly, if the Mtr_B_Spd is greater than or equal to zero, the value of W_Mtr_Test_Status is set equal to C_Mtr_B_Pos_Tq_Test; and if otherwise (i.e., less than zero), is set equal to C_Mtr_B_Neg_Tq_Test, and is stored by the controller. This determination of the value of W_Mtr_Test_Status as a function of the initial motor speed and certain of the test steps which follow therefrom comprise determining a motor torque command as a function of the initial motor speed with regard to motor B. Once the initial program loop and the steps described above have been completed, the program continues to execute in conjunction with subsequent control loops using certain status flag and fixed values stored during prior control loops, as described herein. It will be understood that motor A and motor B may be of different construction and design and may have different motor capacities with regard to output torque, output speed and other motor characteristics. Therefore, the values of the variables and terms defined herein which begin with "K" may have different values associated with motor A and motor B or additional motors which may be utilized. Once the actions taken with regard to block 220 or 320 have been taken, method 100 proceeds to one of blocks 400 (positive torque test) or 500 (negative torque test), depending speed of motor B and the value assigned to W_Mtr_Test Status. If method 100 proceeds to block 400, the steps illustrated in FIG. 8 are performed in a substantially identical manner as those performed with regard to block 200, as described above, except for motor B rather than motor A, and using the variables and terms associated with motor B rather than motor A. Similarly, if method 100 proceeds to block 500, the steps illustrated in FIG. 9 are performed in a substantially identical manner as those performed with regard to block 300, as described above, except for motor B rather than motor A, and using the variable and terms associated with motor B rather than motor A.

The step of determining initial motor speed may be performed using any suitable methods. It may comprise measuring the initial motor speed using a motor speed sensor, but may also comprise calculating the initial motor speed from motor parameters.

The values of K_Mtr_A_Test_Tq and K_Mtr_B_Test_Tq, as well as K_Incr_Mtr_Tq, may also have magnitudes which are a function of an ambient temperature related to the vehicle powertrain system, such as the value of temperature of the oil in the oil sump, Ts.

Further scope of applicability of the present invention will become apparent from the drawings and this detailed description, as well as the following claims. However, it should be understood that the detailed description and specific examples, while indicating preferred embodiments of the invention, are given by way of illustration only, since various changes and modifications within the spirit and scope of the invention will become apparent to those skilled in the art.

The invention claimed is:

1. A method of testing an electric motor that is adapted to provide a desired electric motor output torque to a vehicle powertrain system comprising an engine and the electric motor which are operatively and selectively coupled to a transmission, comprising:
   determining an initial motor speed of the electric motor;
   determining a motor torque command as a function of the initial motor speed;
   applying the motor torque command to the electric motor to produce an output torque from the electric motor;
   measuring a resultant motor speed of the electric motor; and
   establishing a motor status as a function of the resultant motor speed.

2. The method of claim 1, wherein determining the initial motor speed comprises measuring the initial motor speed using a motor speed sensor.

3. The method of claim 1, wherein determining the initial motor speed comprises calculating the initial motor speed from motor parameters.

4. The method of claim 1, wherein determining the motor torque command also comprises determining a torque magnitude, wherein the torque magnitude is a function of an ambient temperature related to the vehicle powertrain system.

5. The method of claim 1, wherein the motor torque command is a positive torque command if the initial motor speed is positive and a negative torque command if the motor speed is negative, wherein positive and negative torque and positive and negative rotational speed are determined with respect to a rotational reference.

6. The method of claim 1, wherein applying the motor torque command comprises applying the torque command for a predetermined torque application interval.

7. The method of claim 5, wherein if the motor command is a positive torque command, establishing a motor status as a function of the resultant motor speed, further comprises:
   determining whether the resultant motor speed is less than or equal to the initial motor speed less a first predetermined limit value, wherein if the resultant motor speed is less than or equal to the initial motor speed less the first predetermined limit value, the motor status is set to a fail status; and
   determining whether the resultant motor speed is greater than or equal to the initial motor speed plus a second predetermined limit value, wherein if the resultant motor speed is greater than or equal to the initial motor speed plus the second predetermined limit value, the motor status is set to a pass status.

8. The method of claim 7, further comprising:
   if the motor status is neither pass nor fail, determining a revised motor torque command by incrementing the motor torque command by a predetermined torque increment;
   applying the revised motor torque command to the electric motor to produce a corresponding revised output torque from the electric motor;
   determining a revised resultant motor speed of the electric motor;
   determining whether the revised resultant motor speed is less than or equal to the initial motor speed less the first predetermined limit value, wherein if the revised resultant motor speed is less than or equal to the initial motor speed less the first predetermined limit value, the motor status is set to a fail status;
   determining whether the revised resultant motor speed is greater than or equal to the initial motor speed plus a second predetermined limit value, wherein if the revised resultant motor speed is greater than or equal to the initial motor speed plus the second predetermined limit value, the motor status is set to a pass status; and
   if the motor status is neither pass nor fail, repeating the preceding steps of this claim for a plurality of cycles which is less than or equal to a motor test cycle limit until the motor status is determined to be pass or fail or the test cycle limit is attained.

9. The method of claim 5, wherein if the motor command is a negative torque command, establishing a motor status as a function of the resultant motor speed, further comprises:
   determining whether the resultant motor speed is greater than or equal to the initial motor speed plus a first predetermined limit value, wherein if the resultant motor speed is greater than or equal to the initial motor speed plus the first predetermined limit value, the motor status is set to a fail status; and
   determining whether the resultant motor speed is less than or equal to the initial motor speed less a second predetermined limit value, wherein if the resultant motor speed is less than or equal to the initial motor speed less the second predetermined limit value, the motor status is set to a pass status.

10. The method of claim 9, further comprising:
    if the motor status is neither pass nor fail, determining a revised motor torque command by incrementing the motor torque command by a predetermined torque increment;
    applying the revised motor torque command to the electric motor to produce a corresponding revised output torque from the electric motor;
    determining a revised resultant motor speed of the electric motor;
    determining whether the revised resultant motor speed is greater than or equal to the initial motor speed plus a first predetermined limit value, wherein if the revised resultant motor speed is greater than or equal to the initial motor speed plus a first predetermined limit value, the motor status is set to a fail status;
    determining whether the revised resultant motor speed is less than or equal to the initial motor speed less a second predetermined limit value, wherein if the revised resultant motor speed is less than or equal to the initial motor speed less the second predetermined limit value, the motor status is set to a pass status; and
    if the motor status is neither pass nor fail, repeating the preceding steps of this claim for a plurality of cycles which is less than or equal to a motor test cycle limit until the test status is determined to be pass or fail or the test cycle limit is attained.

11. The method of claim 8, wherein the predetermined torque increment has a magnitude which is a function of an ambient temperature related to the vehicle powertrain system.

12. The method of claim 10, wherein the predetermined torque increment has a magnitude which is a function of an ambient temperature related to the vehicle powertrain system.

13. A method of testing a plurality of electric motors that are each adapted to provide a desired motor output torque to a vehicle powertrain system comprising an engine and the plurality of electric motors which are operatively and selectively coupled to a transmission, comprising:
  determining an order of testing each of the respective ones of the plurality of electric motors, wherein each of the respective ones is then tested according to the order of testing in the following manner, and wherein reference to the electric motor refers to each of the respective ones as it is tested;
  determining an initial motor speed of the electric motor;
  determining a motor torque command as a function of the initial motor speed;
  applying the motor torque command to the electric motor to produce an output torque from the electric motor;
  measuring a resultant motor speed of the electric motor; and
  establishing a motor status as a function of the resultant motor speed.

14. The method of claim 13, wherein determining the initial motor speed comprises measuring the initial motor speed using a motor speed sensor.

15. The method of claim 13, wherein determining the initial motor speed comprises calculating the initial motor speed from motor parameters.

16. The method of claim 13, wherein determining the motor torque command also comprises determining a torque magnitude, wherein the torque magnitude is a function of an ambient temperature related to the vehicle powertrain system.

17. The method of claim 13, wherein the motor torque command is a positive torque command if the motor speed is positive and a negative torque command if the initial motor speed is negative, wherein positive and negative torque and positive and negative rotational speed are determined with respect to a rotational reference.

18. The method of claim 13, wherein applying the motor torque command comprises applying the torque command for a predetermined torque application interval.

19. The method of claim 17, wherein if the motor command is a positive torque command, establishing a motor status as a function of the resultant motor speed, further comprises:
  determining whether the resultant motor speed is less than or equal to the initial motor speed less a first predetermined limit value, wherein if the resultant motor speed is less than or equal to the initial motor speed less the first predetermined limit value, the motor status is set to a fail status; and
  determining whether the resultant motor speed is greater than or equal to the initial motor speed plus a second predetermined limit value, wherein if the resultant motor speed is greater than or equal to the initial motor speed plus the second predetermined limit value, the motor status is set to a pass status.

20. The method of claim 19, further comprising:
  if the motor status is neither pass nor fail, determining a revised motor torque command by incrementing the motor torque command by a predetermined torque increment;
  applying the revised motor torque command to the electric motor to produce a corresponding revised output torque from the electric motor;
  determining a revised resultant motor speed of the electric motor;
  determining whether the revised resultant motor speed is less than or equal to the initial motor speed less the first predetermined limit value, wherein if the revised resultant motor speed is less the first predetermined limit value, the motor status is set to a fail status;
  determining whether the revised resultant motor speed is greater than or equal to the initial motor speed plus a second predetermined limit value, wherein if the revised resultant motor speed is greater than or equal to the initial motor speed plus the second predetermined limit value, the motor status is set to a pass status; and
  if the motor status is neither pass nor fail, repeating the preceding steps of this claim for a plurality of cycles which is less than or equal to a motor test cycle limit until the motor status is determined to be pass or fail or the test cycle limit is attained.

21. The method of claim 17, wherein if the motor command is a negative torque command, establishing a motor status as a function of the resultant motor speed, further comprises:
  determining whether the resultant motor speed is greater than or equal to the initial motor speed plus a first predetermined limit value, wherein if the resultant motor speed is greater than or equal to the initial motor speed plus the first predetermined limit value, the motor status is set to a fail status; and
  determining whether the resultant motor speed is less than or equal to the initial motor speed less a second predetermined limit value, wherein if the resultant motor speed is less than or equal to the initial motor speed less the second predetermined limit value, the motor status is set to a pass status.

22. The method of claim 21, further comprising:
  if the motor status is neither pass nor fail, determining a revised motor torque command by incrementing the motor torque command by a predetermined torque increment;
  applying the revised motor torque command to the electric motor to produce a corresponding revised output torque from the electric motor;
  determining a revised resultant motor speed of the electric motor;
  determining whether the revised resultant motor speed is greater than or equal to the initial motor speed plus a first predetermined limit value, wherein if the revised resultant motor speed is greater than or equal to the initial motor speed plus a first predetermined limit value, the motor status is set to a fail status;
  determining whether the revised resultant motor speed is less than or equal to the initial motor speed less a second predetermined limit value, wherein if the revised resultant motor speed is less than or equal to the initial motor speed less the second predetermined limit value, the motor status is set to a pass status; and
  if the motor status is neither pass nor fail, repeating the preceding steps of this claim for a plurality of cycles which is less than or equal to a motor test cycle limit until the test status is determined to be pass or fail or the test cycle limit is attained.

23. The method of claim 20, wherein the predetermined torque increment has a magnitude which is a function of an ambient temperature related to the vehicle powertrain system.

24. The method of claim 22, wherein the predetermined torque increment has a magnitude which is a function of an ambient temperature related to the vehicle powertrain system.

* * * * *